(12) United States Patent
Schwartz et al.

(10) Patent No.: US 9,304,147 B2
(45) Date of Patent: Apr. 5, 2016

(54) HIGH CURRENT KELVIN CONNECTION AND VERIFICATION METHOD

(71) Applicant: Integrated Technology Corporation, Tempe, AZ (US)

(72) Inventors: Rodney Schwartz, Austin, TX (US); Gary Rogers, Mesa, AZ (US); Steven Clauter, Goodyear, AZ (US)

(73) Assignee: Integrated Technology Corporation, Tempe, AZ (US)

( * ) Notice: Subject to any disclaimer, the term of this patent is extended or adjusted under 35 U.S.C. 154(b) by 11 days.

(21) Appl. No.: 14/317,499

(22) Filed: Jun. 27, 2014

(65) Prior Publication Data

US 2014/0354319 A1 Dec. 4, 2014

Related U.S. Application Data

(63) Continuation-in-part of application No. 13/090,771, filed on Apr. 20, 2011, now abandoned.

(60) Provisional application No. 61/355,804, filed on Jun. 17, 2010.

(51) Int. Cl.
*G01R 31/20* (2006.01)
*G01R 1/067* (2006.01)
*G01R 27/20* (2006.01)

(52) U.S. Cl.
CPC .......... *G01R 1/06794* (2013.01); *G01R 27/205* (2013.01)

(58) Field of Classification Search
CPC ... G01R 31/20; G01R 27/2605; G01R 27/205
USPC ......... 324/702–713, 600, 546, 505, 547, 726, 324/127
See application file for complete search history.

(56) References Cited

U.S. PATENT DOCUMENTS

| | | | |
|---|---|---|---|
| 4,173,735 A | 11/1979 | Merchant | |
| 4,342,957 A | 8/1982 | Russell | |
| 4,864,285 A | 9/1989 | Rodden | |
| 5,856,736 A | 1/1999 | Rotunda et al. | |
| 5,886,530 A * | 3/1999 | Fasnacht et al. | 324/611 |
| 5,999,002 A | 12/1999 | Fasnacht et al. | |
| 7,521,947 B2 | 4/2009 | Rogers et al. | |
| 2012/0325683 A1 | 12/2012 | Milgrew | |

OTHER PUBLICATIONS

Co-pending U.S. Appl. No. 13/090,771, filed Apr. 20, 2011.

* cited by examiner

*Primary Examiner* — Melissa Koval
*Assistant Examiner* — Trung Nguyen
(74) *Attorney, Agent, or Firm* — Renner, Otto, Boisselle & Sklar, LLP

(57) ABSTRACT

A method and circuit for implementing high current capability Kelvin connections and measuring the resistance of the contacts and connections to verify that the conducting path is capable of carrying the high current without damage or degraded performance. Included as well is the means and circuit for efficiently dividing a high current test stimulus current into 2 paths with low losses and voltage drops.

22 Claims, 12 Drawing Sheets

MATHEMATICAL EXPRESSION:
$R_{OPTO} + R_{KELVIN} = (N_{sec}/N_{pri})^2 * R_1(\frac{V+}{V_{R1}} - 1)$

HIGH CURRENT KELVIN CONNECTION AND VERIFICATION METHOD

RELATED APPLICATION DATA

This application is a continuation-in-part of U.S. application Ser. No. 13/090,771 filed on Apr. 20, 2011, which claims the benefit of U.S. Application No. 61/355,804 filed on Jun. 17, 2010, each of which is hereby incorporated by reference in its entirety.

TECHNICAL FIELD OF THE INVENTION

The present invention relates generally to testing of integrated circuits and power semiconductor devices, and more particularly, to a method and apparatus for implementing Kelvin connections with verification and contact resistance testing capability that is especially useful for high current applications. In addition, these techniques are scalable to more than two Kelvin connections.

DESCRIPTION OF THE RELATED ART

Precision measurement circuits often make use of Kelvin connections (see, e.g., FIG. 1) to provide accurate measurements by removing the effect of contact resistance in series with the measurement stimuli. A force lead connection 10 is typically used to supply the stimuli, and a sense lead 12, which is simply a connection that carries no current, is used to make the measurement. Because the sense lead 12 carries no, or negligible current, the effect of voltage drop in the contacts and leads is eliminated. In a typical test application, dual contacts are made to each lead of the device under test. For integrated circuit chip packages and power semiconductor devices this is often done with a socket configuration having two separate spring contacts to each lead of the device. The force lead is typically connected to one contact and the sense lead to the other.

Testing to verify that the Kelvin connection is properly made confirms both leads are making proper contact. In other types of high current testing, both leads may be used as parallel paths for lower resistance and higher current carrying capacity. In this case, testing the "Kelvin connection" verifies that both leads 10, 12 are properly connected to the test point so both leads can pass high currents and share the load.

In testing of high current devices, a means is used to determine the integrity of the test connections with the device terminals to insure the leads actually are making contact and that the quality of the contact is satisfactory. Connections that have high resistance may cause inaccurate tests, or may damage test contacts. In some situations, high currents are passed to the device under test, while simultaneously, high voltages may be present. The circuitry for determining proper connection integrity must then also be able to withstand the presence of these high voltages during the course of the test. Typically, measurement circuits that can withstand high voltages are high impedance. However, testing for low values of contact resistance generally requires substantial measurement currents, which requires low impedance circuits to avoid dissipating unacceptable amounts of power which would affect measurements.

In some high current testing applications a Force/Sense Kelvin measurement is not required but a modified dual contact system is used to provide parallel high current paths. In this case, there are two Force contacts and the contact resistance of both connections of the contact pair is important because both are passing high current. Splitting the current into two parallel paths has other beneficial effects such as lowering the overall path inductance and resistance. In these cases the current handling capability of individual contacts, such as socket contacts or handler contacts, may not be sufficient to handle the full current required for testing. Adding parallel contacts provides additional current handling capability and reduces stress on the test fixtures. The problem with this approach is that it is difficult to efficiently divide the high current test stimulus in two different paths. Additionally, existing test circuits for verifying the contact integrity are not optimal. The requirement for very low contact resistance in high current paths makes it difficult to verify using existing methods.

Existing test circuits for verification of Kelvin contacts typically use active circuitry which floats with the measurement leads to verify the contact resistance. An example of this type circuitry using optical couplers 20 is shown in FIGS. 2a and 2b. These circuits use a significant number of components and have the disadvantage of requiring a floating power circuit 22, which may have significant capacitance to ground. The circuit is also hard programmed to detect a certain level of contact resistance to determine a failure.

Another example of a circuit designed to verify the quality of the Kelvin contact connections is incorporated in U.S. Pat. No. 5,999,002, Fasnacht et al, which is a continuation in part of U.S. Pat. No. 5,886,530. This circuit attempts to use a transformer to isolate the Kelvin contact resistance measurement from the test stimuli. The technique taught in U.S. Pat. No. 5,999,002 employs a simple single voltage pulse applied to the primary of the transformer that is affected by the secondary resistance of the transformer including the contact resistance between the force and sense leads. The secondary of the transformer is capacitively coupled to the force and sense contacts to isolate the circuit from the measurement stimuli. Although difficult to follow, the techniques disclosed in U.S. Pat. No. 5,999,002 may have theoretically useful properties but this reference basically provides an indication of continuity and not a measurement of resistance in ohms.

As best understood, the technique taught in U.S. Pat. No. 5,999,002, from a practical standpoint, has several problems. First, the secondary of the transformer must be capacitively coupled to the Kelvin contacts to isolate the secondary from the measurement circuit. This creates capacitive loading on the measurement signals, which could degrade the quality of any dynamic measurements. Second, the resistance error threshold of any practical version of the circuit is quite high in comparison to the desired low resistance path of a high current Kelvin connection. In addition, the error threshold is fixed by component values and cannot be programmed or otherwise readily changed to different levels.

The nature of the circuit used in U.S. Pat. No. 5,999,002 seriously limits the sensitivity of the resistance test, so it is difficult, if not impossible, to set tight limits on the contact resistance. In high current testing this can be a very significant problem. Since the circuit uses only a logic level threshold that is compared to the transformer's primary voltage to determine if the contact is good or bad, it does not provide any quantitative measurement of the actual level of the contact resistance. The contact resistance measurement may be extremely important and the actual requirements may vary with different levels of current required for testing different types of devices due to heating and over the lifetime of the contacts. In addition, the measurement current used to determine the contact resistance is not well understood, or predictable, since all that is used is the primary voltage level and current is not a factor. Lastly, as pointed out in U.S. Pat. No.

5,999,002 there are issues with noise pickup and voltage spikes that must be filtered out or ignored in some manner.

Accordingly, there is a need in the art for a fast, accurate method of verifying the contact resistance between the Force and Sense, or two Force leads of a Kelvin connection. The method should be sensitive and accurate enough to discriminate very low resistance values to ensure the connection can pass very high currents, including the case where two parallel forcing leads are used to increase current capability. The method should also be able to provide measurement capability to determine the actual resistance value, not just a comparison to limit in order to accommodate the wide range of possible requirements in a single test station. Measurements should be performed as quickly as possible, especially if there are more than two contacts without the interference of noise or voltages that must be filtered out. The measurement current used should be well defined and predictable. Finally, the method should provide the best means to manage a high current test stimulus that must be divided into two separate Force paths with minimal losses and yet be able to verify the contact resistance at the Kelvin connection.

SUMMARY

Accordingly, a method and system in accordance with the present invention enables integrity verification of Kelvin connections to an integrated circuit, power semiconductor device or other electronic assembly with speed and repeatability. Additionally, a method and system in accordance with the present invention enable measurement of the actual contact resistance of a Kelvin connection with a predetermined measurement current. Further, a method and system in accordance with the present invention enable integrity verification of Kelvin connections in the presence of high voltages. Also, a method and system in accordance with the present invention provide a simple method of utilizing the same connections to Kelvin connected leads that may be used to provide two parallel high current paths to a test point. The integrity verification of such connection can be scaled and expanded to a plurality of connections. In addition, little or no power is dissipated until the resistance measurement is performed. Finally, it is important to note this method and system utilize a predetermined measurement current while performing the actual resistance measurement of the Kelvin connection.

According to one aspect of the invention, a device for measuring impedance of a Kelvin connection to a circuit of interest and for injecting a test stimulus into the circuit of interest includes: a first transformer having a primary winding and a secondary winding; a first input device for receiving a Kelvin test input waveform, the first input device electrically coupled to the primary winding; first and second test leads for connection to the circuit of interest, the first and second test leads electrically connected to first and second ends, respectively, of the secondary winding; a sensing device electrically coupled to the primary winding, the sensing device operative to provide a measurement corresponding to a contact impedance across at least one of the first and second test leads based on impedance reflected from the secondary winding to the primary winding in response to application of the Kelvin test input waveform to the first input device.

According to one aspect of the invention, the device includes a second input device for receiving the test stimulus, the second input device electrically coupled to the secondary winding.

According to one aspect of the invention, the secondary winding comprises a first winding part and a second winding part, one end of the first winding part connected to one end of the second winding part via a center tap, and wherein the second input device is electrically connected to the center tap.

According to one aspect of the invention, a turns ratio of the first winding part is equal to a turns ratio of the second winding part.

According to one aspect of the invention, a turns ratio of the first winding part is different from a turns ratio of the second winding part.

According to one aspect of the invention, the sensing device comprises a resistor connected to the primary winding.

According to one aspect of the invention, the first input device comprises a driver amplifier electrically connected to one end of the primary winding.

According to one aspect of the invention, the first input device comprises a switching device electrically connected to one end of the primary winding.

According to one aspect of the invention, the first input device comprises a switching device configured to selectively couple a first and second end of the primary winding to the Kelvin test input waveform.

According to one aspect of the invention, the device includes a waveform generator for generating the Kelvin test input waveform, the waveform generator operatively coupled to the first input device.

According to one aspect of the invention, the waveform generator is configured to generate two alternating waveforms out of phase from one another, and the first input device provides one of the two alternating waveforms to a first end of the primary winding, and the other of the two alternating waveforms to a second end of the primary winding.

According to one aspect of the invention, the device includes a resistor electrically connected in series between the secondary winding and one of the first or second test leads.

According to one aspect of the invention, the device includes a switching device having a switch portion and an enable portion for controlling a state of the switch portion, the switch portion being electrically connected in series between the secondary winding and one of the first or second test leads to selectively couple the secondary winding to the one of the first or second test leads, and the enable portion being electrically connected to an input of the first input device to control the state of the switch portion.

According to one aspect of the invention, the device includes a second transformer and a third transformer, the second and third transformers each including a secondary winding with a center tap, wherein the center tap of the second transformer is electrically connected to one end of secondary winding of the first transformer and the center tap of the third transformer is electrically connected to the other end of the secondary winding of the first transformer.

According to one aspect of the invention, the device includes: a third test lead and a fourth test lead for connection to the circuit of interest; and a second transformer and a third transformer, the first, second and third transformers each including a center tap in the secondary winding, wherein the center tap of the first transformer is electrically connected to one end of the secondary winding of the second transformer, the center tap of the third transformer is electrically connected to the other end of the secondary winding of the second transformer, a primary winding of the first transformer is electrically connected to a primary winding of the third transformer, and the third and fourth test leads are electrically connected to first and second ends, respectively, of the secondary winding of the third transformer.

According to one aspect of the invention, the device includes a comparator operatively coupled to the sensing device, the comparator configured generate a signal indicative of the measured impedance being at least one of above or below a predetermined threshold.

According to one aspect of the invention, a method for measuring contact impedance of a Kelvin connection using at least one transformer having a primary winding and a secondary winding is provided. The method includes: connecting each end of the secondary winding to a respective contact of a contact pair for which the impedance is to be measured; applying a waveform to the primary winding; sensing an impedance reflected from the secondary winding to the primary winding in response to the applied waveform; and correlating the reflected impedance to the contact impedance.

According to one aspect of the invention, sensing an impedance includes sensing flow of current in the primary winding in response to the applied waveform.

According to one aspect of the invention, the method includes: comparing the sensed current flow to a predetermined value; and concluding the resistance of the contact pair is acceptable or unacceptable based on the comparison.

According to one aspect of the invention, sensing the reflected impedance includes sensing current flowing from a center tap of the primary winding in response to the applied waveform.

According to one aspect of the invention, applying a waveform includes applying a first alternating waveform to a first end of the primary winding, and a second alternating waveform to a second end of the primary winding.

According to one aspect of the invention, applying a waveform includes applying a single square-wave pulse to a first end of the primary winding, and sensing the reflected impedance includes sensing current flowing from a second end of the primary winding.

According to one aspect of the invention, the second waveform is out of phase from first waveform.

According to one aspect of the invention, a method of detecting a resistance imbalance between two connections to a circuit of interest is provided. The method includes: coupling a secondary winding of a transformer to the circuit of interest; injecting a test stimulus current at a center tap of the secondary winding; concluding there is a resistance imbalance between the two connections when a voltage across a primary winding of the transformer exceeds a predetermined voltage.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the scope of the claims appended hereto.

Features that are described and/or illustrated with respect to one embodiment may be used in the same way or in a similar way in one or more other embodiments and/or in combination with or instead of the features of the other embodiments.

DETAILED DESCRIPTION OF EMBODIMENTS

Figure 1:
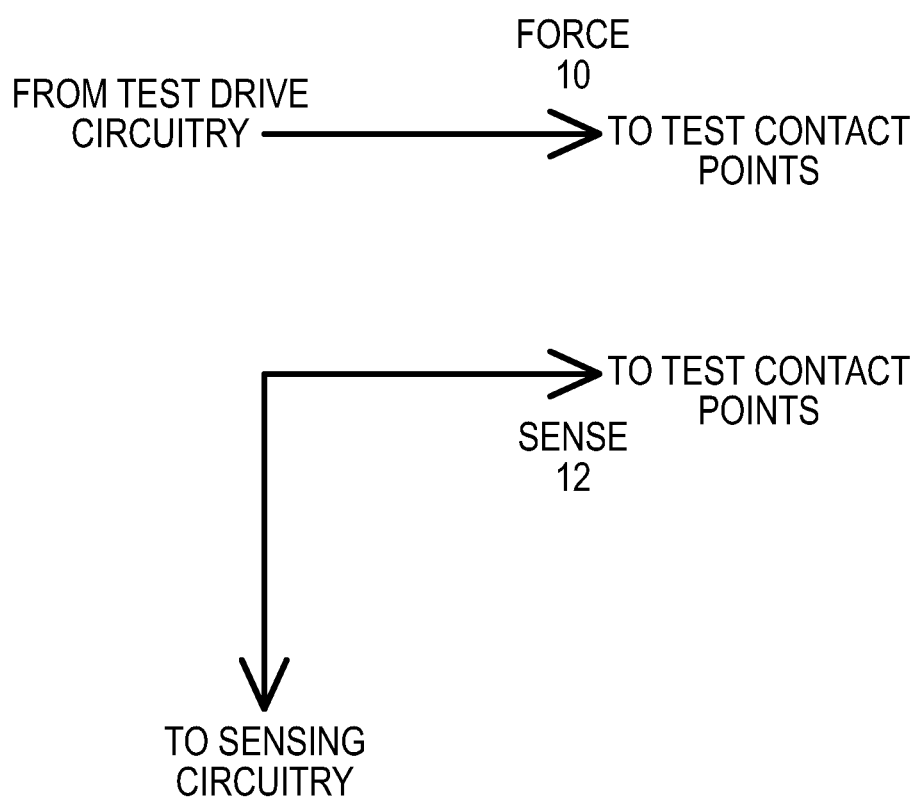
FIG. 1 is a schematic diagram of a conventional Kelvin connected measurement circuit.
Figure 2A:
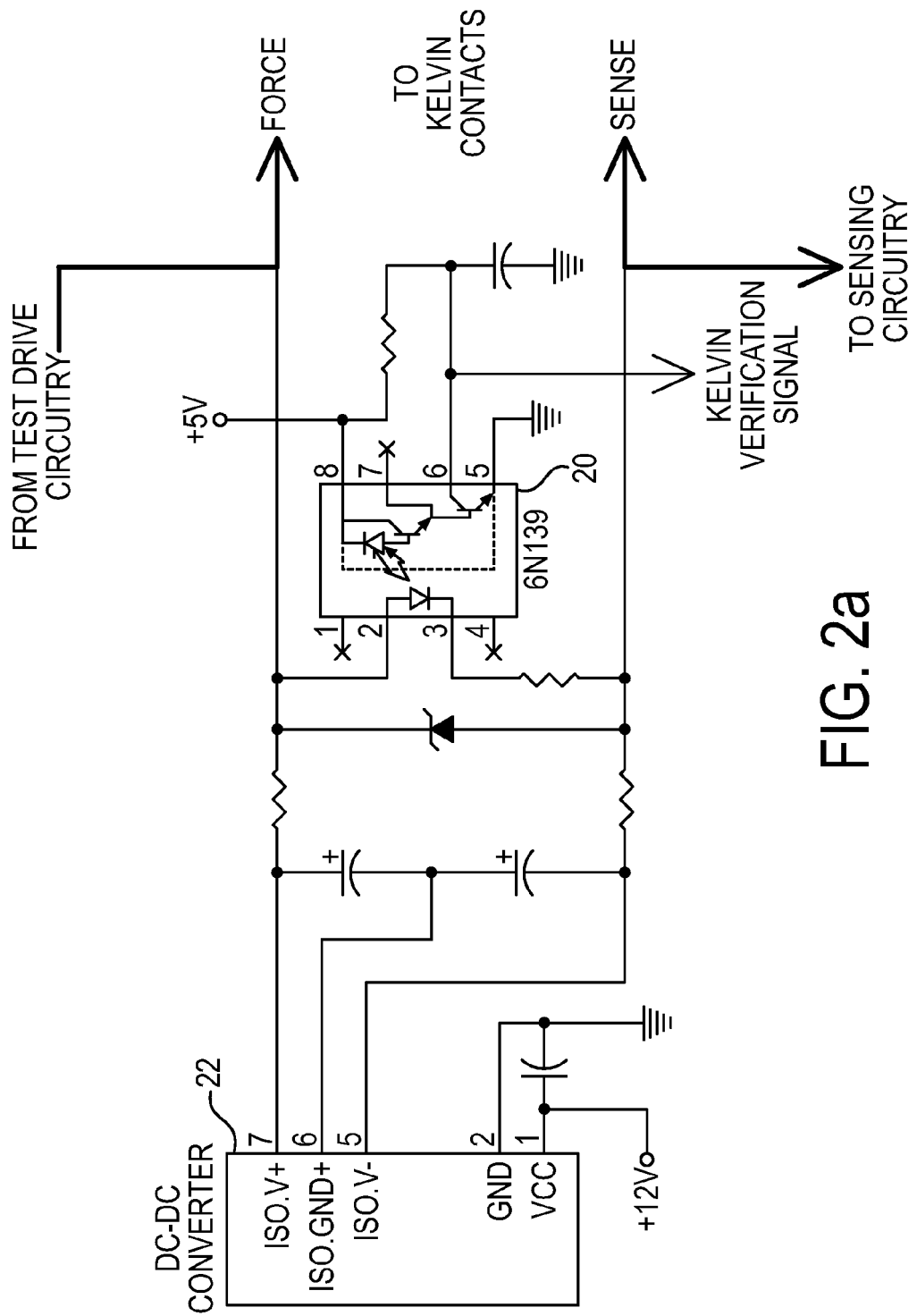
FIG. 2a is a schematic diagram of a typical conventional Kelvin verification circuit with separate Force and Sense Kelvin connections.
Figure 2B:
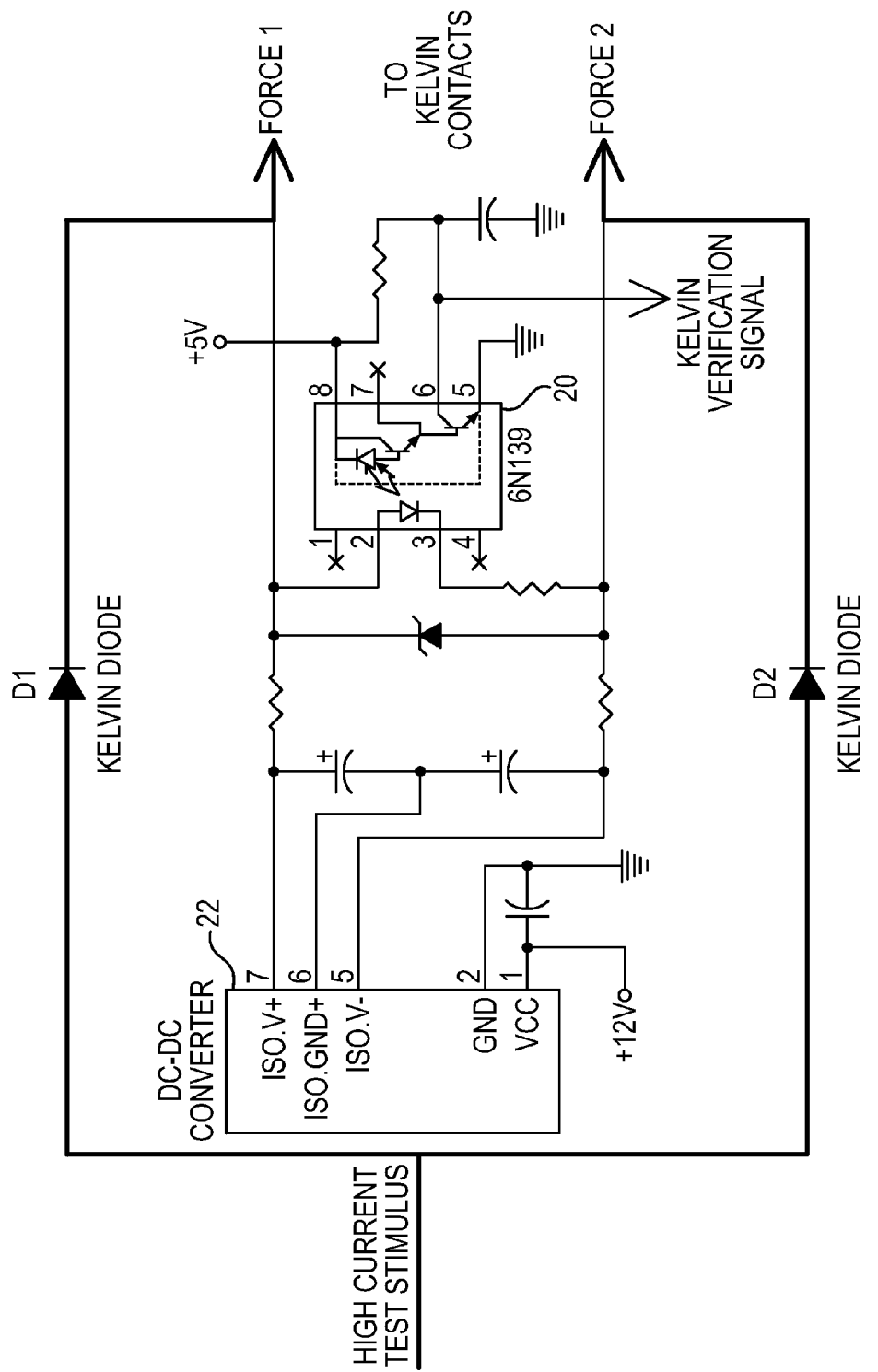
FIG. 2b is a schematic diagram of a conventional Kelvin verification circuit with two parallel high current, or Force, Kelvin connections from a single high current test stimulus. Therefore, two Kelvin diodes are utilized to isolate the Force connections for Kelvin verification.

Embodiments of the present invention will now be described with reference to the drawings, wherein like reference numerals are used to refer to like elements throughout. It will be understood that the figures are not necessarily to scale.

Figure 3A:
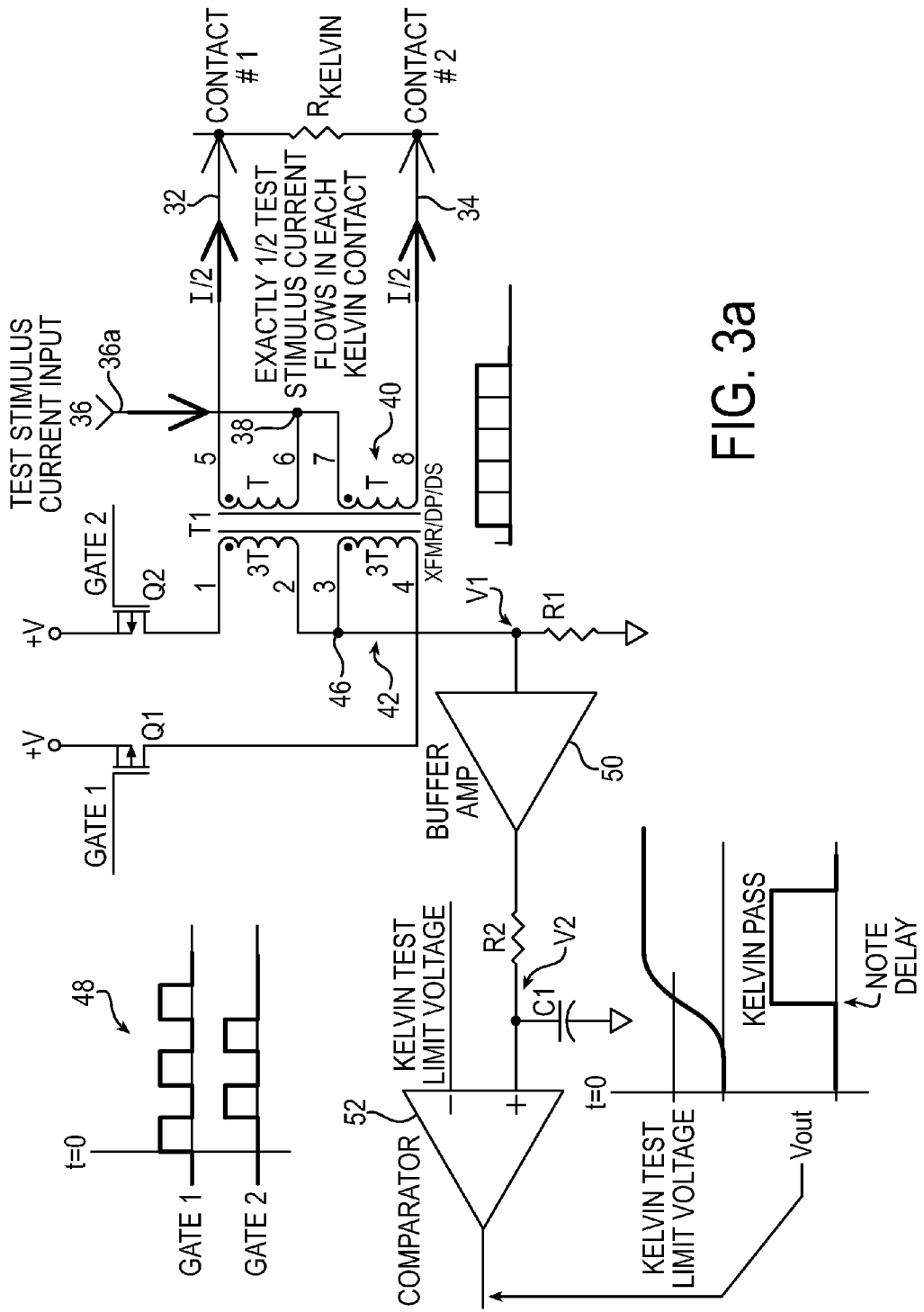
FIG. 3a is a schematic diagram of an exemplary high current Kelvin verification circuit in accordance with the present invention and showing a Test Stimulus being divided into two parallel force paths without any Kelvin diodes utilizing a single transformer.

A circuit has been developed that provides several advantages over previously employed circuitry. The advantages can include:
1. relative simplicity
2. high voltage isolation
3. high current capability 4. maximal utilization of test contacts
5. variable threshold
6. ruggedness
7. low voltage and power losses
8. high speed measurements
9. adaptable to a plurality of contacts
10. ability to maintain current sharing in contacts
11. low noise measurements An embodiment of a circuit 30 for high current capability is shown in FIG. 3a. The circuit is advantageous in that it combines dividing high current into two current paths with Kelvin contact resistance measurement utilizing only one transformer.

Test contact points 32, 34 are contacts that will be connecting to the device under test and the contact resistance of these connections will be determined via the circuit shown. Note that Kelvin diodes are not needed since the same transformer, T1, is also used to divide the Test Stimulus current.

A test stimulus 36 can be injected into the circuit via line 36a, which is electrically connected to a center tap 38 on a secondary winding 40 of transformer T1. One end of the secondary winding 40 is electrically connected to first contact point 32 and another end of the secondary winding 40 is electrically connected to second contact point 34.

Input drivers, such as transistors Q1 and Q2, provide signals to respective ends of the primary winding 44 based on a signal 48 applied to gates of the respective transistors. Additionally, the primary winding 44 of transformer T1 includes a center tap 46 connected to signal common through resistor R1. A buffer amplifier 50 is electrically connected to resistor R1 to obtain a voltage drop across the resistor R1, and an output of buffer amplifier 50 is connected to a positive input of comparator 52 via an RC network formed from resistor R2 and capacitor C1. A negative input to comparator 52 is connected to a Kelvin Test Limit voltage.

During operation, test stimulus 36, such as current stimulus having a predetermined magnitude, can be provided on line 36a from the high current source that will be used in testing of the device. As can be seen in FIG. 3a, the test stimulus 36 is applied to a center tap 38 on a secondary winding 40 of a transformer T1. This winding is preferably constructed with heavy gauge wire so that it can pass the high test currents. The applied test stimulus 36 will then accurately divide (one-half of the current passing though each contact points) with low losses and pass on to each of the test contact points 32, 34. Accordingly, both contact points 32, 34 may be used for passing currents resulting from the test stimulus 36, which allows application of approximately twice the test current as compared to schemes that use conventional Force and Sense connections for forcing the test stimulus on one line and sensing of voltage on the other.

The primary winding 44 of the transformer T1 is fed with alternating pulses of opposite phase via transistors Q1 and Q2 (e.g., switching devices). The return path for the current through either half of the primary winding 44 is via the center tap 46 and a current sensing device, such as resistor R1. While a resistor is shown as a current sensing device, any current to voltage conversion technique may be utilized without departing from the scope of the invention.

During the contact measurement operation, driver transistors (not shown) generate alternating pulsed gate waveforms 48 shown in FIG. 3a, which are applied to the gates of Q1 and Q2, respectively. As Q1 and Q2 alternately conduct V+(e.g., 5 VDC) to the corresponding ends of the primary winding 44, the resulting alternating voltage applied to the primary winding appears across the secondary winding 40 in relation to the turns ratio of the windings. Since higher currents are typically applied to measure low values of contact resistance, it is then advantageous to utilize a higher turns count on the primary side and a lower turns count on the secondary side. In one embodiment, the turns ratio is on the order of 3:1, primary to secondary. This ratio is optimized to suit the expected Kelvin contact resistance and desired measurement current.

Note that each winding 40 and 44 is symmetrical about the center tap (which insures that, during testing, the high current test stimulus will divide evenly, plus the mutual inductance will cancel the inductance in each of the two secondary high current paths). The secondary voltage is then applied across the Kelvin test contacts 32 and 34 and a current will flow in relation to the applied primary voltage turns ratio (which is chosen to be compatible with the expected Kelvin contact resistance range and desired measurement current) and the actual contact resistance. Due to the coupling between the primary and secondary windings, a current will flow in the primary winding 44 of the transformer T1 due to the reflected secondary impedance. This impedance is the contact resistance that is reflected back to the primary winding in relation to the turns ratio of the transformer T1, and this impedance can be determined by the voltage appearing across R1 due to the resulting primary current. The voltage across R1 can then be used to calculate the contact resistance of the testing contacts.

Due to the arrangement of the circuitry, gate pulses, and windings, the voltage appearing at R1 is essentially DC, referenced to ground, and requires very little additional detection circuitry or filtering. If the turns ratio, applied voltage, and value of R1 are properly chosen so as not to saturate the transformer core, a signal of sufficient amplitude will be developed and additional amplification of the voltage across R1 may not be required. The turns ratio, applied voltage, and value of R1 can be chosen such that the transformer core will not saturate if the applied primary voltages do not exceed the Volt-Seconds rating of the transformer core.

The current through R1 increases as the Kelvin resistance ($R_{Kelvin}$) decreases and thus the voltage across R1 is indicative of the Kelvin resistance. The voltage across R1 (or other sensing device) can be provided to a buffer amplifier 50 and then to comparator 52, which can be configured to provide an output indicative of whether the measured impedance is acceptable or unacceptable (e.g., above a predetermined threshold, below a predetermined threshold, etc.).

It is further shown that any variations in the output of the buffer amplifier 50 can be filtered with R2 and C1. This filter will add a slight time delay but results in a precise signal level that can be used by a comparator to determine if the Kelvin resistance is acceptable. It is noted that this signal level could also be input to an Analog-to-Digital converter. The actual Kelvin resistance can then be measured from the digital output of the Analog-to-Digital conversion. As the Kelvin resistance decreases, the voltage V1 increases and, after a time delay, V2 rises above a Kelvin test limit voltage setpoint provided to the comparator 52 and a Kelvin PASS signal is output.

At this point the advantages of using a current technique to measure Kelvin resistance through the transformer T1 will be discussed. Namely, the current in the transformer starts at zero (0) amps and builds up to a maximum value based on the applied voltage, the value of R1, turns ratio and contact resistance, which is maintained until the transformer saturates. The Kelvin resistance can be read after a known time delay as the current rises to its final value. The current rise time is primarily due to leakage inductance in the transformer T1. There is also very little noise since the leakage inductance acts a filter to keep the current signal from picking up high frequency noise. The maximum or value of secondary current used for the resistance measurement is based on the primary applied voltage divided by the resistor R1 and then multiplied by the turns ratio. This is expressed as:

$$I_{sec} = V^+/R1 * (N_{pri}/N_{sec}), \text{ in amps}$$

Since higher measurement current enables accurate reading of low resistances, using the turns ratio of the transformer is a good method to achieve high measurement currents with low power dissipation. The basic transformer relationships are:

$$Z_{pri}/Z_{sec} = (N_{pri}/N_{sec})^2 \text{ or in terms of resistances,}$$

$$R_{pri}/R_{sec} = (N_{pri}/N_{sec})^2 \text{ or in terms of } R_{kelvin} \text{ and } R_{reflected}$$

$$R_{reflected}/R_{kelvin} = (N_{pri}/N_{sec})^2$$

i.e., the impedance ratio is equal to the square of the turns ratio $$V_{r1} = (R1)*(V^+)/(R_{reflected} + R1)$$

Therefore:

$$V_{r1} = (R1)*(V^+)/(R1 + ((N_{pri}/N_{sec})^2 * R_{kelvin}))$$

Solving for the unknown impedance across the contact points gives:

$$Z_{sec} = \frac{(N_{pri}/N_{sec})^2}{R_1 \left( \frac{V+}{V_{R_1}} - 1 \right)}$$

And the final result is the expression to determine $R_{kelvin}$:

$$R_{kelvin} = (N_{sec}/N_{pri})^2 * R1 * ((V^+/V_{r1}) - 1)$$

Thus by specifying a suitable measurement current for the Kelvin contacts 32 and 34, the associated components then can be determined such that $R_{kelvin}$ can be measured.

During the testing of the device, the pulsing of transistors Q1 and Q2 may be stopped, and the test stimulus current may be applied to the center tap 38 of the secondary winding 40. Since the current flows in opposing directions in each half of the winding 40, no net flux is produced and no currents will appear on the primary winding 44. This also cancels out the inductance of the secondary winding 40 so there is essentially no net effect of transformer T1 and the test stimulus current is efficiently divided into two separate current paths with low losses. In the situation that the currents do not evenly balance due to unequal contact resistance, currents will be induced in the primary winding 44. Due to the choice of a relatively small magnetic core for the transformer T1, the energy that is coupled through the transformer before the core saturates is small, and can be easily absorbed by Q1, Q2, small transient suppressor diodes or Zeners (not shown).

The magnetic core selected for transformer T1, along with the number of turns on the primary winding are selected such that saturation of the core does not occur at the switching frequency chosen for the drive signal to Q1 and Q2 when the secondary is open circuited. Further, the turns ratio of the primary to secondary can be optimized to provide maximal sensitivity to low contact resistances, while minimizing the power that must be applied to the primary.

Figure 3B:
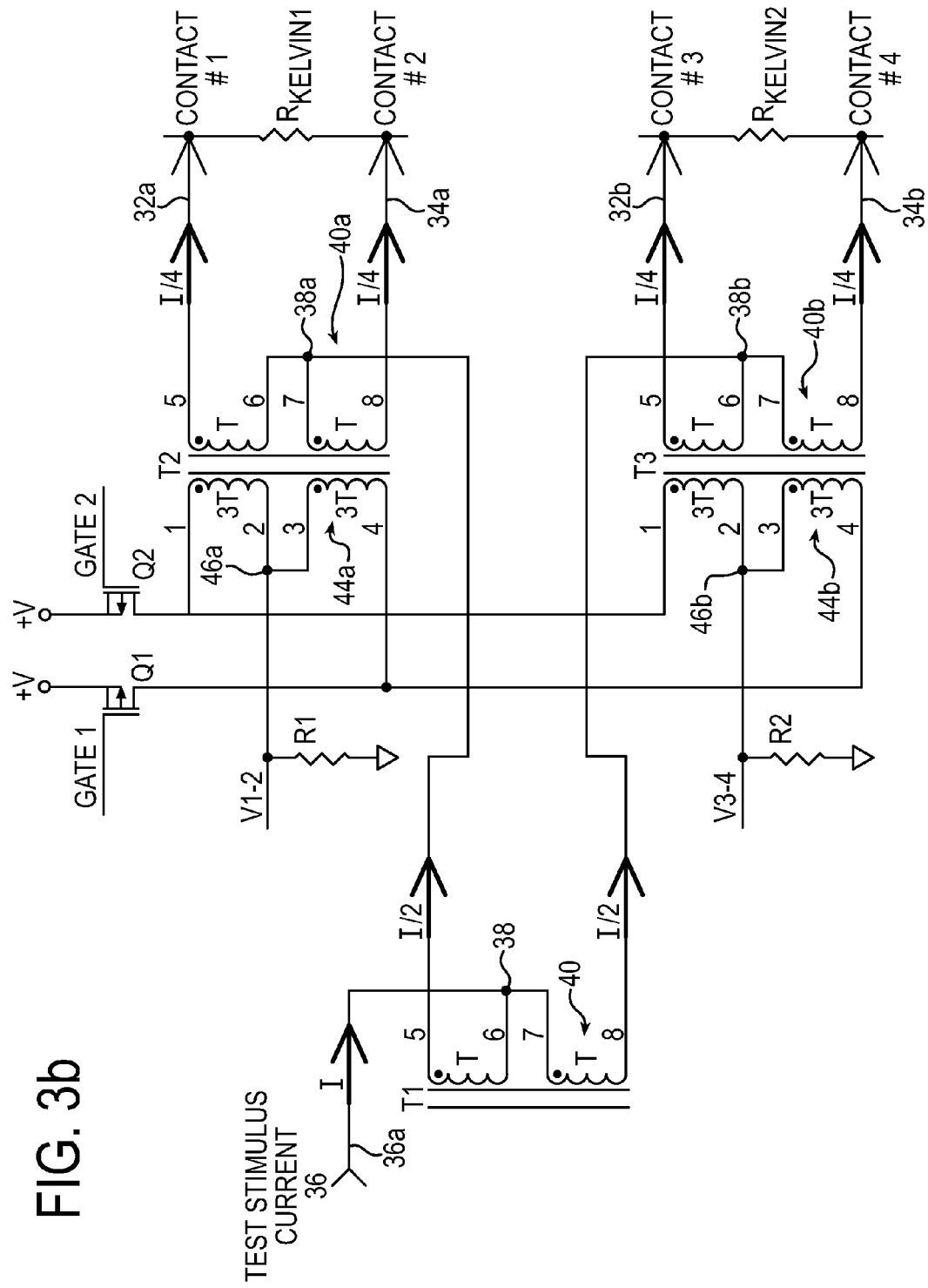
FIG. 3b is a schematic diagram of showing how the circuitry in FIG. 3a can be expanded to a plurality of contacts which are driven in parallel.
Figure 3C:
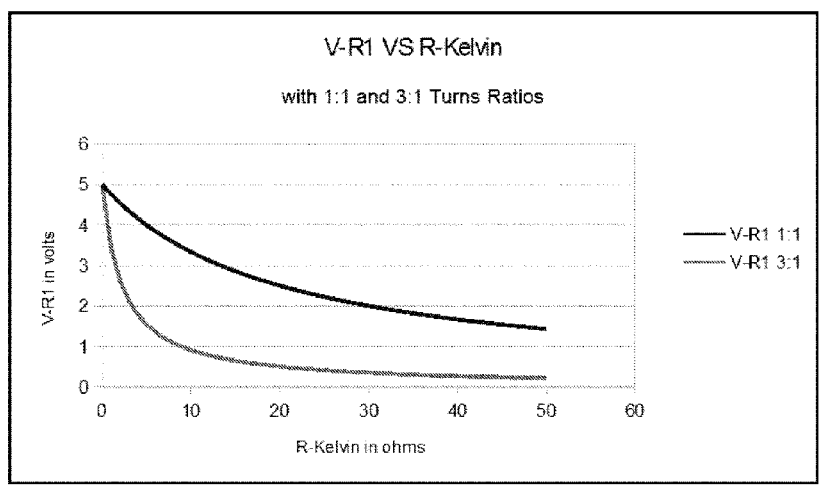
FIG. 3c is a graph illustrating an exemplary representation of $R_{kelvin}$ vs V1.

In graphical terms, a typical representation of $R_{kelvin}$ vs V1 is illustrated in FIG. 3c. Note the response is most sensitive at lower values of $R_{kelvin}$, which is most important for high current testing since any resistance can cause poor test results or damage the Device Under Test. Also note the beneficial effect of increasing the Primary-to-Secondary turns ratio of the transformer T1 results in improving the sensitivity of the method at low values of $R_{kelvin}$. Low values of $R_{kelvin}$ can be easily, quickly and accurately resolved.

As shown in FIG. 3b this basic technique can be scaled up to handle more than just one pair of Kelvin contacts while at the same time utilizing the same transformer and current paths used by the Test Stimulus Current. More specifically, FIG. 3b includes the transformer T1 as described with respect to FIG. 3a and associated circuitry (not shown), as well as two additional transformers T2 and T3. Instead of the secondary windings of transformer T1 being coupled to the Kelvin contacts, a first end of secondary winding 40 is connected to a center tap 38a of transformer T2, and a second end of secondary winding 40 is connected to a center tap 38b of transformer T3. A first end of transformer T2's secondary winding 40a is connected to first contact 32a, and a second end of transformer T2's secondary winding 40a is connected to a second contact 34a. Similarly, a first end of transformer T3's secondary winding 40b is connected to first contact 32b, and a second end of transformer T3's secondary winding 40b is connected to a second contact 34b. Primary windings of transformers T2 and T3 also include a respective center tap 46a and 46b connected to signal common through resistors R1 and R2, respectively. Transistors Q1 and Q2 provide driving signals on respective ends of the transformer primary windings 44a and 44b. The primary winding 44 of transformer T1 is connected as shown in FIG. 3a. Further, and although not shown, a buffer and/or comparator may be coupled across resistors R1a and R1b. In the circuit of FIG. 3b, the current in each leg of windings 40a and 40b is halved such that now one quarter of the current flows through each test Kelvin contact 32a, 34a, 32b and 34b.

Figure 4:
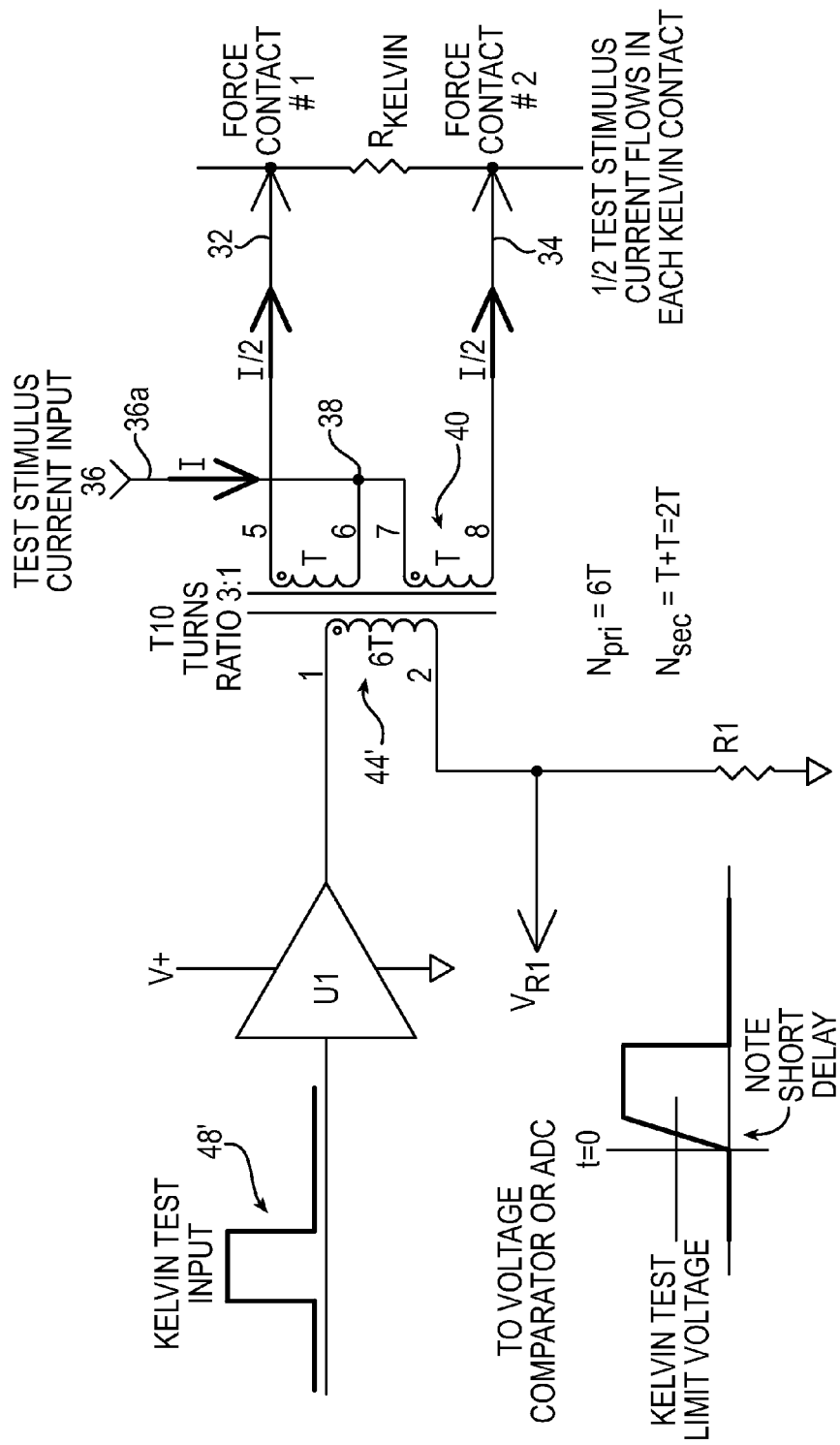
FIG. 4 is a schematic diagram on another exemplary high current Kelvin verification circuit showing a simplified drive configuration which utilizes a single pulse to verify the Kelvin connection of two high current, and balanced, paths in accordance with the present invention.

Referring now to FIG. 4, a circuit is shown that combines division of the test stimulus current 36 into two current paths with Kelvin contact resistance measurement using only a single transformer. More specifically, the basic Kelvin verification method has been further simplified to use a single winding 44' on the primary of the transformer T10, and to utilize just one pulse 48'. Like before, the transformer T10 is chosen to be compatible with the expected Kelvin contact resistance range and desired measurement current. The single pulse may be applied to the primary winding 44' via driver U1 (which may be any commercially available Driver U1) to enable measurement of $R_{kelvin}$. No filtering of any kind is needed. The resulting current in the primary of the transformer T10 is based on the reflected Kelvin resistance, and is converted to voltage $V_{R1}$ by resistor R1, which can be sampled after a short delay.

If the voltage $V_{R1}$ rises above a Kelvin Test Limit Voltage provided to the comparator (not shown in FIG. 4), then it can be concluded that $R_{kelvin}$ is less than the maximum resistance limit. The only delay in the circuit of FIG. 4 is due to the small amount of leakage inductance of T10. Further, there is very little noise or error voltages. A resistance measurement can be obtained based on the value of $V_{R1}$. For example, $V_{R1}$ may be sampled by an Analog-to-Digital Converter, which can produce a digital value corresponding to the a resistance measurement in ohms. The circuit of FIG. 4 is advantageous in that a simple, lower-cost circuit can be used to provide accurate Kelvin measurements.

Figure 5:
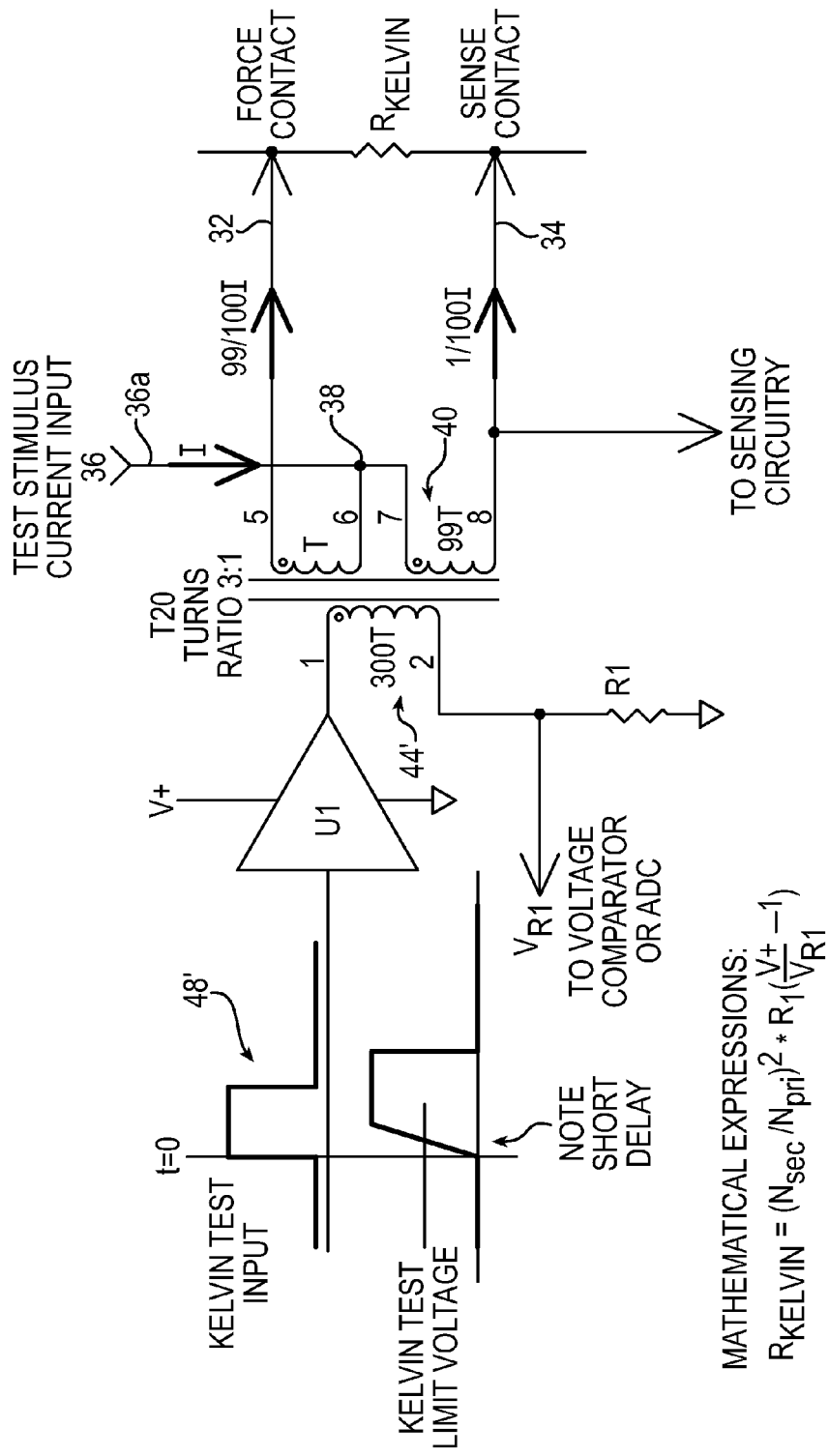
FIG. 5 is a schematic diagram of yet another exemplary Kevin verification circuit between Force and Sense contacts in accordance with the present invention. Different turns ratios on the secondaries of the transformer divide the Test Stimulus Current whereby essentially all current flows in the Force contact but still provides a Sense contact for voltage measurement.

FIG. 5 illustrates another embodiment of a circuit in accordance with the present invention. The embodiment of FIG. 5 is similar to the embodiment of FIG. 4. However, the basic Kelvin verification method has been modified for a Force and Sense Kelvin connections 32 and 34 using a different number of turns on the two secondary windings of transformer T20.

The desired effect is to direct 99% (or other predetermined percentage) of the Test Stimulus Current 36 into the Force Kelvin contact 32, which then allows the Sense Kelvin contact 34 (which carries very little current) to accurately measure voltages. Therefore, the Sense Kelvin connection can be connected to the Sensing Circuitry. Kelvin resistance can be measured with only a single pulse, and the resulting current in the primary of transformer T20 is based on the reflected Kelvin resistance. The primary current is converted to voltage $V_{R1}$ by resistor R1.

The primary winding of T20 has been increased to keep the ratio of the Primary-to-Secondary at 3:1. Increasing the primary windings is relatively easy since the currents are low and the primary is low voltage.

Figure 6:
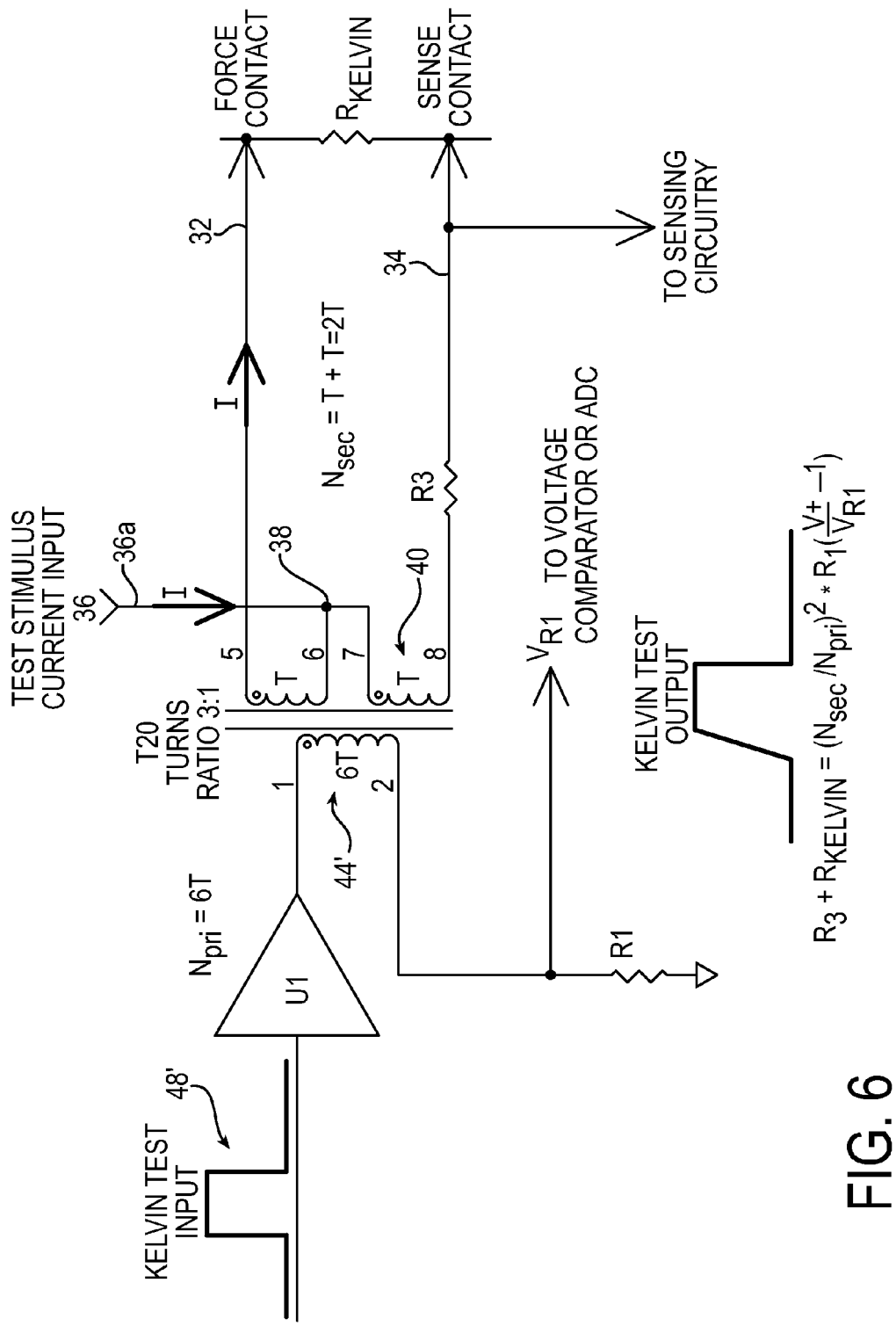
FIG. 6 is a schematic diagram of yet another exemplary Kelvin verification circuit between Force and Sense contacts in accordance with the present invention. In this case, the transformer has the same low number of turns but one secondary which is connected to the Sense contact has a resistor in series with the current path to help divert essentially all the Test Stimulus Current into the Force contact.

Referring now to FIG. 6, the basic Kelvin verification method has been modified for a Force and Sense Kelvin connections. The circuit of FIG. 6 combines division of the test stimulus current into two unequal current paths with total Kelvin contact resistance measurement ($R_3+R_{Kelvin}$) using only a single transformer. The circuit of FIG. 6 is similar to the circuit of FIG. 4, except that resistor R3 has been added in the secondary of T20. The resistor R3 causes an imbalance in the transformer secondary winding 40 which results in a rise in flux in the transformer T20. As a result, transformer T20, which preferably has a relatively small core with a low volt-seconds product (thus enabling saturation at low currents), will saturate when the Test Stimulus is first applied to the center tap 38. When the transformer T20 saturates, due to the low resistance through the transformer to the force contact 32 essentially all of the test current flows through the Force Kelvin connection 32. The Sense Kelvin connection 34 to the device under test will carry little or no current and thus accurately sense voltage.

The point of saturation is determined by the volt-seconds rating of the transformer T20, which is usually on the order of 50 volt-microseconds. Therefore with a 5 volt drop across the resistor R3, the other side of the transformer T20 will need to also generate a 5 volt offset. After just 10 microseconds the transformer T20 would saturate and essentially all the current would pass through the Force Kelvin contact 32. The Sense Kelvin connection 34, which now carries little or no current (most current passes through the Force Kelvin connection 32 due to it having a significantly lower resistance) will then sense the voltage accurately. Note the resistor R3 will be added to the total Kelvin Resistance measurement. As a result, if R3 is a precision resistor, $R_{kelvin}$ can be determined based on the difference between the measured resistance and the value of R3. Finally R3 can be used to identify test fixtures or setups that are subject to being exchanged for different testing purposes such as with probe cards. The voltage $V_{R1}$ across R1 due to a single gate pulse is a factor of the Kelvin resistance and can be sampled after a short delay.

Figure 7:
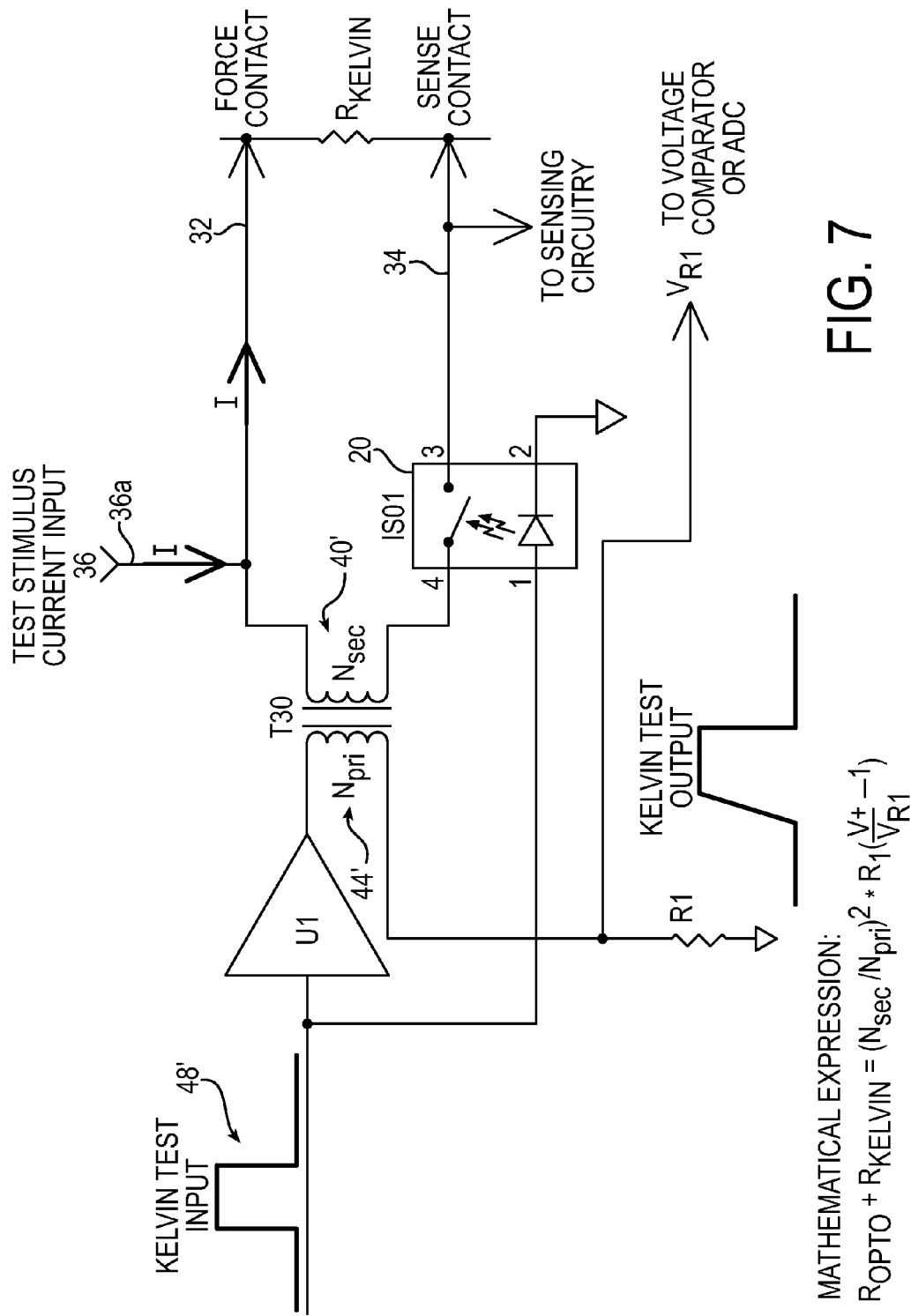
FIG. 7 is a schematic diagram of yet another exemplary Kelvin verification circuit between Force and Sense contacts utilizing an optically isolated switch in accordance with the present invention. The optical switch is closed to perform the Kelvin verification and then opened just before the Test Stimulus Current is applied. Therefore all of the Test Stimulus Current flows through the Force connection which allows the Sense connection to measure voltages accurately

Referring to FIG. 7, another embodiment of a circuit in accordance with the present invention is illustrated. The circuit of FIG. 7 is similar to the circuit of FIG. 4, except that the transformer T30 has a single-primary and single-secondary winding, and is only used from measuring the Kelvin resistance by sensing the resulting current that flows in the primary winding and through R1. Additionally, transformer T30 does not include a center tap on the secondary winding 40', and an opto switch 20 is connected in one leg of the secondary winding 40'. Since the secondary winding does not have a center tap, the test stimulus current 36 is input directly to the Force Kelvin contact 32. In FIG. 7 the basic Kelvin verification method has been modified to isolate the Force and Sense Kelvin connections 32 and 34 using the opto-isolator 20. In this case, the Test Stimulus Current 36 can only flow through the Force Kelvin contact 32 when the opto-isolator 20 is turned OFF. The opto-isolator 20 can be turned ON just before a Kelvin Resistance measurement is performed. The opto-isolator 20 can then be turned OFF after the Kelvin test and before the test stimulus is applied to the Force Kelvin connection 32. Note the Test Stimulus current 36 does not flow through the transformer T30 at any time. Again, the voltage $V_{R1}$ across R1 due to a single gate pulse is a factor of the Kelvin resistance and can be sampled after a short delay.

Figure 8:
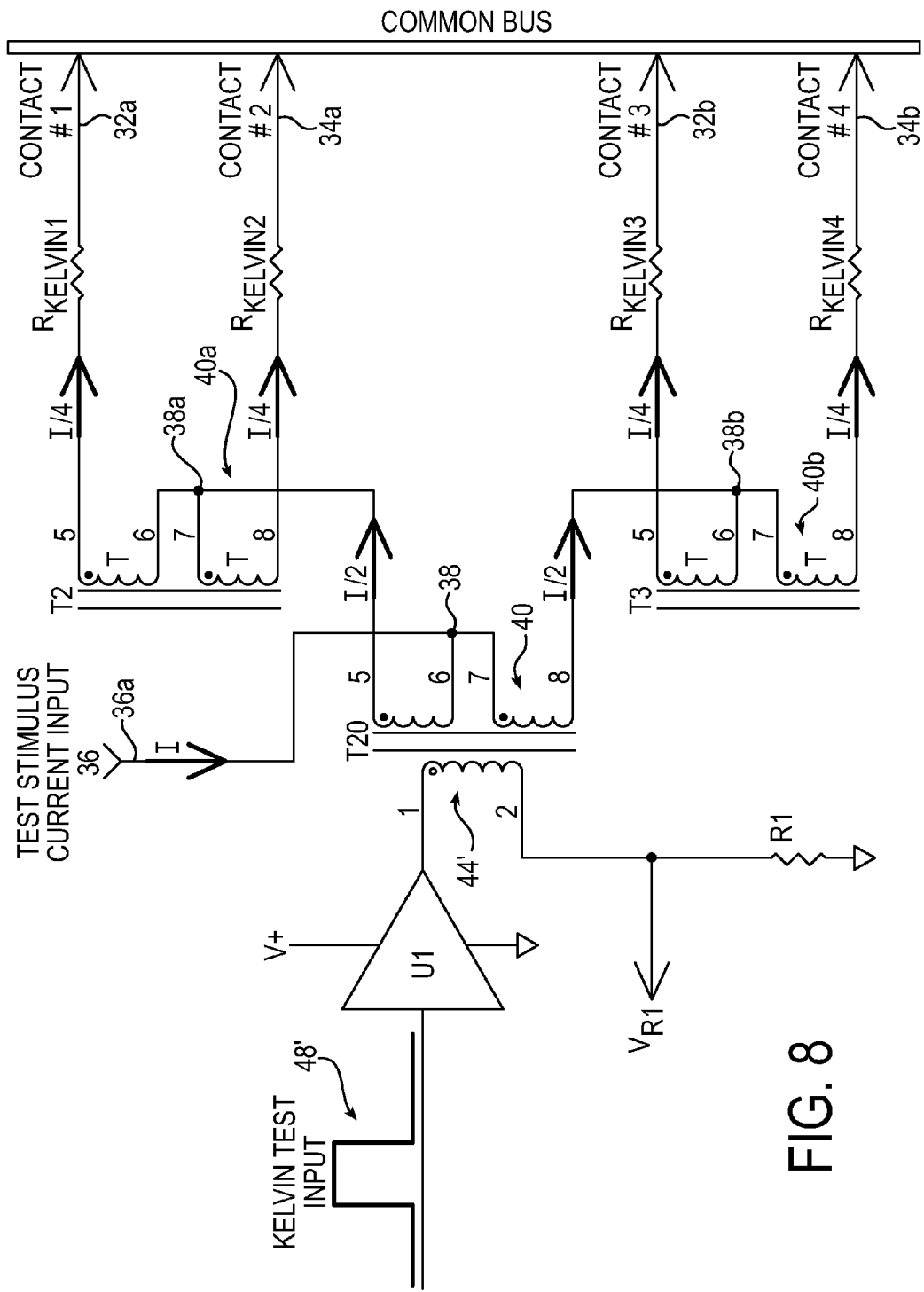
FIG. 8 is a schematic diagram of yet another exemplary Kelvin verification circuit which can be scaled to a plurality Force Kelvin connections utilizing a input single transformer in accordance with the present invention. This results in only one Kelvin verification measurement to verify all Kelvin connections using the same current path as the Test Stimulus Current.
Figure 9:
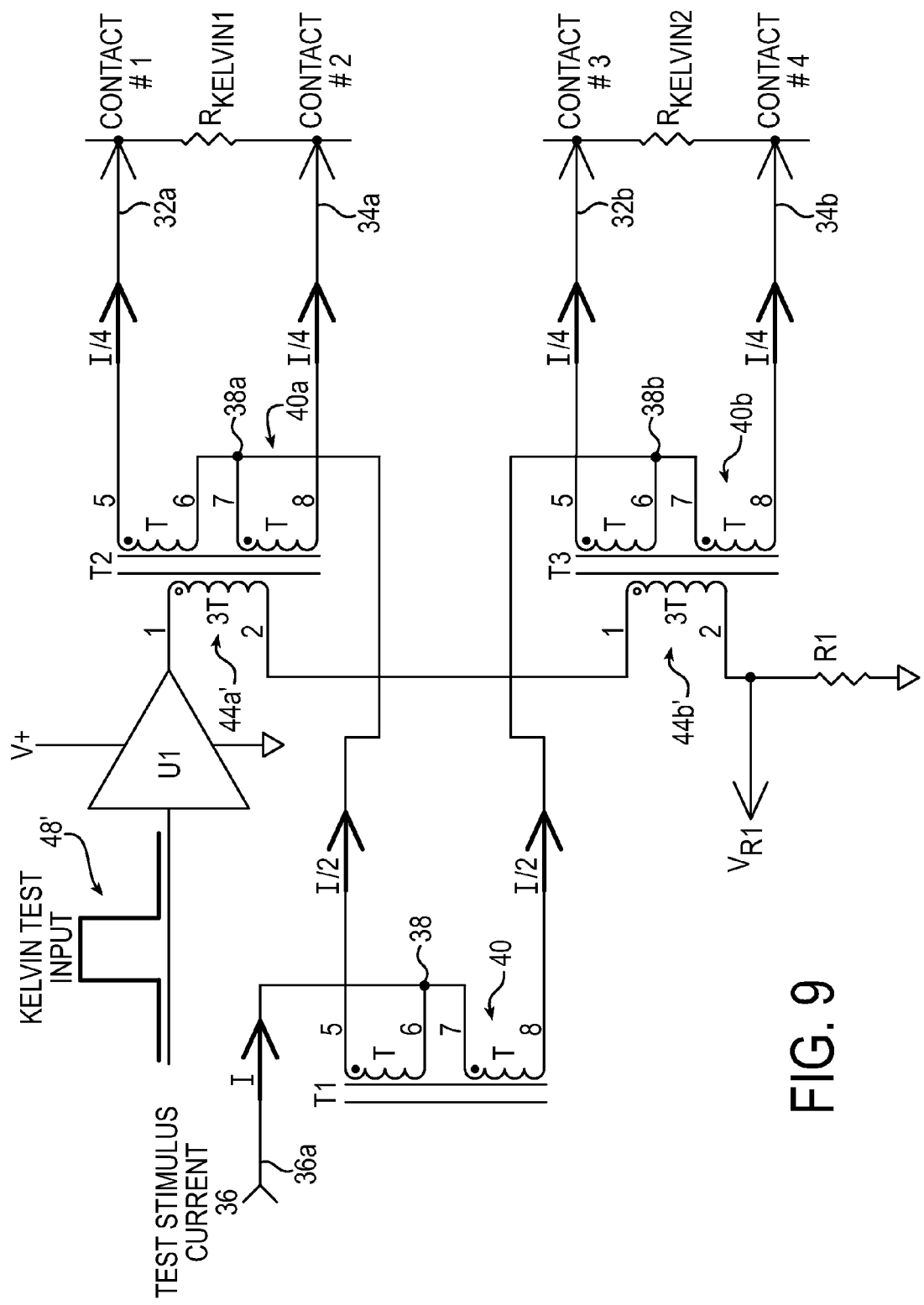
FIG. 9 is a schematic diagram of yet another exemplary Kelvin verification circuit which can be scaled to a plurality Force Kelvin connections utilizing transformers driven in series in accordance with the present invention. This enables a number of Kelvin contacts to be verified at the same time.

Referring to FIG. 8, the basic Kelvin verification method as shown in FIG. 4 is applied to a plurality of Kelvin connections 32a-32d (similar to the configuration shown in FIG. 3b). While the configuration of the primary windings of transformers T2 and T3 is not shown in FIG. 8, it is understood that the primary windings may be configured as shown in FIG. 3b or as shown in FIG. 9 (discussed below).

In FIG. 8, multiple Kelvin connections are grouped together and sampled using a single Kelvin test. In this regard, the Kelvin connections are individually checked for connection to the common bus.

In operation the Kelvin resistance measurement current is divided equally by the secondary of each transformer T2 and T3. As a result, the test stimulus current is applied to all four Kelvin connections such that each connection carries one-quarter of the test stimulus current.

The voltage $V_{R1}$ is a measurement of the combination of series-parallel Kelvin resistance. The circuit of FIG. 8 is advantageous in that one Kelvin test can quickly determine a) if any one or more Kelvin Force connections are high resistance and b) verify that the Test Stimulus Current path is complete.

Moving now to FIG. 9, the basic Kelvin verification method is applied to a plurality of Kelvin connections whereby a single Kelvin test can be used to sense if any pair of Kelvin Force Connections are high resistance. The circuit of FIG. 9 includes the transformer T1 as described with respect to FIG. 3a and associated circuitry coupled to the primary winding (not shown), as well as two additional transformers T2 and T3. Instead of the secondary winding 40 of transformer T1 being coupled to the Kelvin contacts, a first end of secondary winding 40 is connected to a center tap 38a of transformer T2, and a second end of secondary winding 40 is connected to a center tap 38b of transformer T3. A first end of transformer T2's secondary winding 40a is connected to first Kelvin contact 32a, and a second end of transformer T2's secondary winding 40a is connected to a second Kelvin contact 34a. Similarly, a first end of transformer T3's secondary winding 40b is connected to third Kelvin contact 32b, and a second end of transformer T3's secondary winding 40b is connected to a fourth Kelvin contact 34b. A driver U1 is coupled to one end of primary winding 44a of transformer T2, and the other end or primary winding 44a is connected to one end of primary winding 44b of transformer T3. The other end of primary winding 44b is connected to signal common via resistor R1.

The voltage developed across resistor R1 the result of the sum of the two Kelvin resistors $R_{kelvin1}$ and $R_{kelvin2}$.

The circuit of FIG. 9 is advantageous in that it enables multiple Kelvin connections to be simultaneously tested during a single test. In this regard, one quarter of the stimulus current applied to the center tap 38 of transformer T1 passes through each Kelvin contact 32a, 34a, 32b, and 34b.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A device for measuring impedance of a Kelvin connection to a circuit of interest and for injecting a test stimulus into the circuit of interest, comprising:
   a first transformer having a primary winding and a secondary winding, wherein the secondary winding comprises a first winding part having a first end and a second winding part having a second end, the first winding part connected to the second winding part via a center tap;
   a first input device for receiving a Kelvin test input waveform, the first input device electrically coupled to the primary winding;
   a second input device for receiving the test stimulus, the second input device electrically connected to the center tap of the secondary winding;
   first and second test leads for connection to the circuit of interest, the first and second test leads electrically connected to the first end and the second end, respectively, of the secondary winding;
   a sensing device electrically coupled to the primary winding, the sensing device operative to provide a measurement corresponding to a contact impedance between the first and second test leads based on impedance reflected from the secondary winding to the primary winding in response to application of the Kelvin test input waveform to the first input device and the test stimulus.

2. The device according to claim 1, wherein a turns ratio of the first winding part is equal to a turns ratio of the second winding part.

3. The device according to claim 1, wherein a turns ratio of the first winding part is different from a turns ratio of the second winding part.

4. The device according to claim 1, wherein the sensing device comprises a resistor connected to the primary winding.

5. The device according to claim 1, wherein the first input device comprises a driver amplifier electrically connected to one end of the primary winding.

6. The device according to claim 1, wherein the first input device comprises a switching device electrically connected to one end of the primary winding.

7. The device according to claim 1, wherein the first input device comprises a switching device configured to selectively couple a first and second end of the primary winding to the Kelvin test input waveform.

8. The device according to claim 1, further comprising a waveform generator for generating the Kelvin test input waveform, the waveform generator operatively coupled to the first input device.

9. The device according to claim 8, wherein the waveform generator is configured to generate two alternating waveforms out of phase from one another, and the first input device provides one of the two alternating waveforms to a first end of the primary winding, and the other of the two alternating waveforms to a second end of the primary winding.

10. The device according to claim 1, further comprising a resistor electrically connected in series between the secondary winding and one of the first or second test leads.

11. The device according to claim 1, further comprising a switching device having a switch portion and an enable portion for controlling a state of the switch portion, the switch portion being electrically connected in series between the secondary winding and one of the first or second test leads to selectively couple the secondary winding to the one of the first or second test leads, and the enable portion being electrically connected to an input of the first input device to control the state of the switch portion.

12. The device according to claim 1, further comprising a second transformer and a third transformer, the second and third transformers each including a secondary winding with a center tap,
   wherein the center tap of the second transformer is electrically connected to one end of secondary winding of the first transformer and the center tap of the third transformer is electrically connected to the other end of the secondary winding of the first transformer.

13. The device according to claim 1, further comprising:
   a third test lead and a fourth test lead for connection to the circuit of interest; and
   a second transformer and a third transformer, the first, second and third transformers each including a center tap in the secondary winding, wherein
   the center tap of the first transformer is electrically connected to one end of the secondary winding of the second transformer,
   the center tap of the third transformer is electrically connected to the other end of the secondary winding of the second transformer,
   a primary winding of the first transformer is electrically connected to a primary winding of the third transformer, and
   the third and fourth test leads are electrically connected to first and second ends, respectively, of the secondary winding of the third transformer.

14. The device according to claim 1, further comprising a comparator operatively coupled to the sensing device, the comparator configured generate a signal indicative of the measured impedance being at least one of above or below a predetermined threshold.

15. A method for measuring contact impedance of a Kelvin connection using at least one transformer having a primary winding and a secondary winding, the method comprising:
   connecting each end of the secondary winding to a respective contact of a contact pair for which the impedance is to be measured;
   applying a waveform to the primary winding;
   sensing an impedance reflected from the secondary winding to the primary winding in response to the applied waveform by sensing current flowing in the primary winding in response to the applied waveform; and
   correlating the reflected impedance to the contact impedance.

16. The method according to claim 15, wherein sensing an impedance includes sensing flow of current in the primary winding in response to the applied waveform.

17. The method according to claim 16, further comprising:
   comparing the sensed current flow to a predetermined value; and
   concluding the resistance of the contact pair is acceptable or unacceptable based on the comparison.

18. The method according to claim 15, wherein sensing the reflected impedance includes sensing current flowing from a center tap of the primary winding in response to the applied waveform.

19. The method according to claim 15, wherein applying a waveform includes applying a first alternating waveform to a first end of the primary winding, and a second alternating waveform to a second end of the primary winding.

20. The method according to claim 15, wherein applying a waveform includes applying a single square-wave pulse to a first end of the primary winding, and sensing the reflected impedance includes sensing current flowing from a second end of the primary winding.

21. The method according to claim 20, wherein the second waveform is out of phase from first waveform.

22. A method of detecting a resistance imbalance between two connections to a circuit of interest, the method comprising:
- coupling a secondary winding of a transformer to the circuit of interest;
- injecting a test stimulus current at a center tap of the secondary winding;
- concluding there is a resistance imbalance between the two connections when a voltage across a primary winding of the transformer exceeds a predetermined voltage.

* * * * *